United States Patent

Krüger et al.

[11] 4,134,808
[45] Jan. 16, 1979

[54] METHOD OF TRIMMING ELECTRONIC COMPONENTS HAVING AN INTEGRATED CIRCUIT TO DESIGN SPECIFICATION

[75] Inventors: Günter Krüger, Leonberg; Klaus Küttner, Stuttgart; Manfred Widmaier, Leonberg; Erich Leinauer, Besigheim, all of Germany

[73] Assignee: Robert Bosch GmbH, Stuttgart, Germany

[21] Appl. No.: 870,470

[22] Filed: Jan. 18, 1978

[30] Foreign Application Priority Data

Jan. 20, 1977 [DE] Fed. Rep. of Germany ....... 2702207

[51] Int. Cl.² ........................... C25F 3/02; C25F 5/00; C25D 21/12
[52] U.S. Cl. ........................ 204/129.2; 204/129.75; 204/228
[58] Field of Search ............ 204/129.2, 129.75, 129.6, 204/224 M, 224 R, 228

[56] References Cited

U.S. PATENT DOCUMENTS

| | | | |
|---|---|---|---|
| 3,148,129 | 9/1964 | Basseches et al. | 204/228 X |
| 3,282,821 | 11/1966 | Cistola | 204/129.2 X |
| 3,408,274 | 10/1968 | Hoffman | 204/129.75 |
| 3,481,843 | 12/1969 | Koo | 204/228 X |

FOREIGN PATENT DOCUMENTS 1200238 7/1970 United Kingdom .................. 204/129.2

*Primary Examiner*—John H. Mack
*Assistant Examiner*—D. R. Valentine
*Attorney, Agent, or Firm*—Flynn & Frishauf

[57] ABSTRACT

A thin film path of medium resistivity provided by a strip of tantalum by which a design parameter of an electronic component is determined is modified by making contact with the path by an electrode having an electrolyte at its tip in passing an anodizing current into the path through the electrode that is much smaller in value than the normal current flowing through the path under design conditions of operation. In consequence, the current injected to produce chemical change in the resistance has a negligible effect on the characteristics of operation of the component and the component can have operating conditions applied to it during the trimming process can be carried while the component is under operating conditions and the parameter to be adjusted is being measured, so that the measurements of the parameter can control the current injected through the electrode so as to shut it off when the desired value of the measured parameter is reached. When the difference between actual and desired values reaches a certain small value, it is advantageous to switch over the current source for the electrode to a lower value of current in order to make possible a closer approach to the design value.

6 Claims, 4 Drawing Figures

METHOD OF TRIMMING ELECTRONIC COMPONENTS HAVING AN INTEGRATED CIRCUIT TO DESIGN SPECIFICATION

This invention relates to a method of trimming electrical components containing thin film circuits to component specifications, and a circuit arrangement for performing the method.

BACKGROUND AND PRIOR ART.

In the manufacture of integrated electronic components manufacturing tolerances are set that require trimming of the components after they have been produced by mass production operations. On the basis of the necessary external connections of the integrated circuit components it is known to produce hybrid components in which an integrated circuit in the form of a semi-conductor chip is combined with discrete components. If the so constituted hybrid component is made in such a way that the circuit elements necessary for adjusting the operation of the components are provided as discrete circuit elements, it is possible by modifying these discrete circuit elements to trim the electrical properties of the component. Thus it is possible, for example, to provide a resistance that determines the operating behavior of the component by the use of thin film technology and to produce the trimming of the entire component by affecting this resistance.

German published Patent Application (OS) 1 640 518 discloses a method and apparatus for trimming active electrical circuit elements in which the adjustment of the circuit element is carried out by removing material from a resistor or from another circuit element that is variable in its electrical characteristics by removal of material. The apparatus for performing this method includes a sand blasting device for removal of material by which a resistance provided as a layer on a substrate can be progressively reduced in extent until the electrical circuit element has the desired characteristics. With the apparatus shown in that published patent application it is also possible to control the process of removal of material with reference to the desired dc characteristics of the circuit element.

It is further known to change, by removal of a material by means of a laser, circuit elements of an integrated circuit provided in the form of layers on a substrate.

A disadvantage of the known methods is that in making use of a laser or a sandblasting device and, it is necessary to score the substrate at least lightly. The risk here arises that the region of the substrate at which material must be removed may be the starting point for undesired microcracks. A further disadvantage of the known process is that the electrical properties of the layer material are changed along the incision resulting from the removal of material. Furthermore, the known process can lead to distorting the paths of conductors and resistances and thereby causing the critical current density to be exceeded in these paths.

A method was disclosed in the publication "Thin Solid Films" vol. 12 (1972) pages 335–339, in which by oxidation of a tantalum layer provided on a substrate the electrical properties of the tantalum layer can be modified. The tantalum layer serving as a circuit element of an integrated circuit is in this case covered with an electrolyte in to which an electrode dips. If now a negative voltage is applied to the electrode and a positive voltage is applied to a conducting layer making contact with a boundary of the tantalum layer, a flow of current is provided from the voltage source over the electrode, through the electrolyte, the tantalum layer and the conducting layer back to the voltage source. By selection of a suitable electrolyte a portion of the metallic tantalum layer can be changed into a non-conducting compound. If the electrolyte, for example, contains $OH^-$ ions, the tantalum at the boundary surface between electrolyte and tantalum layer is converted into tantalum oxide according to the equation:

$$2\ T_a^{5+} + 10\ OH^- \rightarrow Ta_2O_5 + 5H_2O$$

In this manner it is possible by a chemical reaction in a thin film path to carry out a trimming of an electrical component.

A disadvantage of the process just described is that with such an anodizing current the thin film path carries a current, so that the trimming of the component as a whole during typical operation cannot in every case be performed, because the anodizing current necessary for the electrolytic conversion process can impair the operating characteristics of the component to such an extent that a continuous adjustment is no longer possible. If it is desired to measure the operating characteristics of the component during the trimming operation, the trimming operation must be performed iteratively, i.e. the trimming can be performed only in small steps and after each step the characteristic values of the component must be measured anew. That, however, is very expensive and time consuming and therefore not practically usuable in large scale manufacture of integrated circuit elements.

The Present Invention.

It is an object of the present invention to provide a method and apparatus for trimming electrical components containing film circuits to specification while they are subject to typical operating conditions and while the operating characteristics can be continuously measured for the purpose of control of a trimming operation.

Briefly, while the components are in operation under typical operating conditions an auxiliary current is passed through a thin film path the characteristics of which can be modified so as to control a parameter of the component, the modification being by chemical change of the conductivity of the thin film path, which is done typically by the provision of an electrode near the thin film path and an electrolyte between the electrode and the thin film path, in combination with a source of the auxiliary current. The auxiliary current is produced in such a way that the voltage drop produced by it in the thin film path influences the electrical characteristic to be adjusted at the end of the adjustment process only within a predetermined range. More particularly, the voltage drop produced by the auxiliary current in the thin film path is substantially smaller than that produced by the normal operating current in the same path. The thin film path can conveniently be provided as an external resistance of an integrated circuit component. Preferably the thin film path is made of tantalum and the electrolyte is a paste containing $OH^-$ ions. A measuring device can conveniently be used to measure a characteristic parameter of the component under adjustment and the output of the measuring device can control the value of auxiliary current in response to the measured parameter.

The method of the invention has the advantage that the trimming of the electronic component can be carried out under difficult operation conditions. In this way, a quick and low cost manufacture of electronic components trimmed to specification is made possible.

DRAWINGS, ILLUSTRATING AN EXAMPLE.

The invention is further described by way of example with reference to the accompanying drawings, in which.

DESCRIPTION OF THE EXAMPLES.

Figure 1:
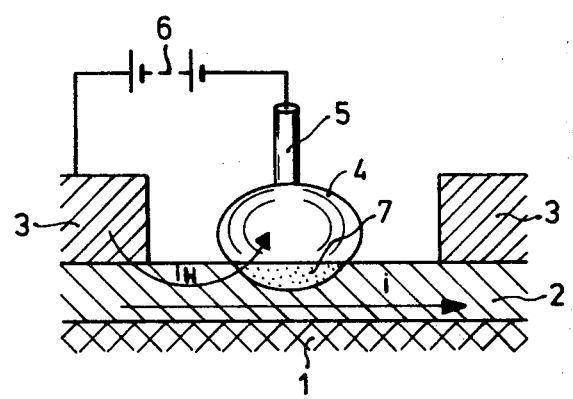
FIG. 1 is a diagram, showing a cross-section of a portion of a thin film conducting path to which an electrolyte has been applied in which an electrode is immersed, for explaining the method of the invention.
Figure 2:
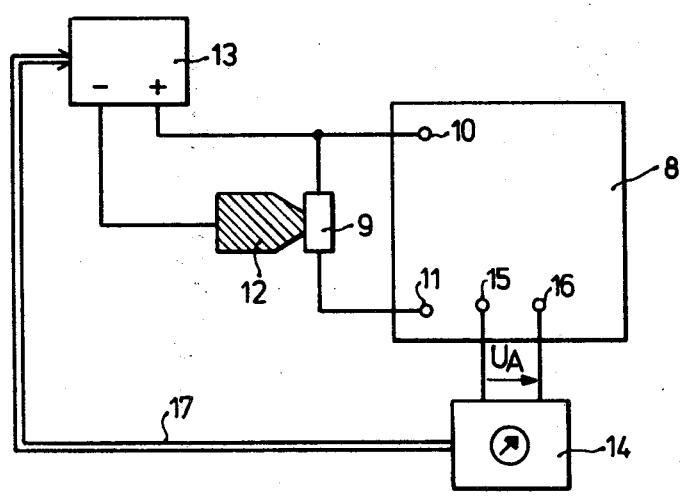
FIG. 2 is a diagram of apparatus for carrying out the method of the invention.

FIG. 1 shows a basic diagram for explaining the method of the invention. A thin film path 2 of a material of medium conductivity, preferably tantalum, is provided on a substrate 1. The thin film path 2 at its ends is terminated by contact with portions of a conductive layer 3 that is preferably made of copper. By this arrangement, an ohmic resistance is produced having contacts at the two ends with the respective portions of the conductive layer 3. An electrolyte 4 is applied to the surface of the thin film path 2 and an electrode 5 dips into the electrolyte. The electrode 5 is connected with the negative pole of a voltage source 6 and one of the portions of the conductive layer 3 is connected with the positive pole of the voltage source. An ohmic resistance formed by the thin film path 2 is a part of the circuit of an integrated circuit component of which a significant electrical characteristic can be adjusted by adjusting this ohmic resistance. Under typical operation of the integrated circuit element, the thin film path 2 is traversed by the flow of a current i. If the voltage source 6 is connected in the above described way between the electrode 5 and the conductive layer 3, an auxiliary current $i_H$ flows through the conductive layer 3, the thin film layer 2, the electrolyte 4 and the electrode 5. This auxiliary current produces a chemical conversion of the material forming the thin film path 2 at the boundary surface between the thin film path 2 and the electrolyte 4. By a suitable choice of the material of the thin film path 2, for example, tantalum, and of the electrolyte 4, a non-conducting oxide 7 is produced at the boundary surface between the thin film path 2 and the electrolyte 4, tantalum oxide in the illustrated example ($Ta_2O_5$). The amount of the oxide 7 is proportional to the strength of the auxiliary current and to the period of auxiliary current flow and it increases the ohmic resistance of the thin film path 2. FIG. 2 is a diagram of an apparatus for carrying out the method of the invention. A component 8 has certain response values and curves that can be measured at the terminals 15 and 16. The characteristic responses of the integrated circuit contained in the component 8 can be adjusted by changing the value of an ohmic resistor 9. The resistor 9 is made accessible in the component 8 between the connections 10 and 11 as shown in FIG. 2. An electrode 12 provided with electrolyte at its tip is placed on the resistor 9. The negative pole of an electronically controlled current source 13 is connected to the electrode 12. The positive pole of the regulated current source 13 is connected to the connection point 10 of the resistor 9 on the component 8. The connection points 15 and 16 of the component 8 are connected with a measuring device 14 from which a control connection 17 leads to the control input of the controlled current source 13. An output voltage $U_A$ can, for example, be measured at the connection points 15 and 16 of the component 8, and is shown in its dependence upon the time t in FIG. 3. The output voltage $U_A$ may, for example, be a significant value characterizing the operating behavior of the component. If now the component 8 is set into operation under the conditions for which it was designed in some manner not further shown in the drawing, by applying the operating voltage, the measuring device 14 indicates an output voltage $U_A$, the value of which deviates from the design value $U_S$ on account of manufacturing tolerances under which the component 8 was made. The output voltage $U_A$ of the component 8 can now be reduced by increasing the value of the resistance 9. For this purpose the control current source 13 is switched and the thin film path 2 constituting the resistance 9 begins to be subjected to the chemical transformation process in the manner described above. This can be observed in FIG. 3 by the course of the voltage 18.

Figure 3:
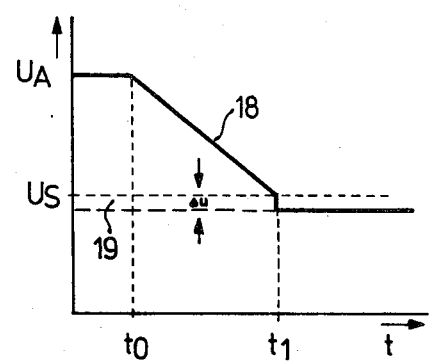
FIG. 3 is a graph of the time course of a voltage in the equipment of FIG. 2.
Figure 4:
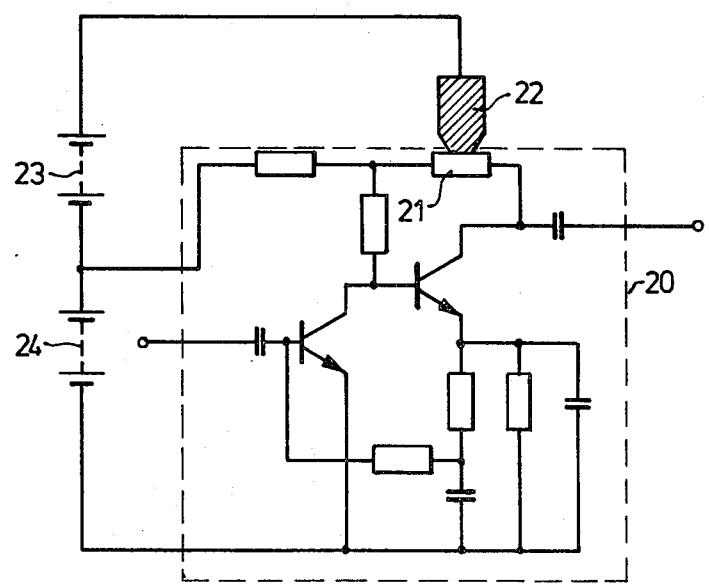
FIG. 4 is the basic circuit diagram of an arrangement for making use of the method of the invention.

As soon as the output voltage design value $U_S$ is reached, the controlled current source 13 is switched off by hand or by automatic regulation over the control connection 17. In the case of automatic regulation, the measured parameter of the component 8 is compared with a design value and the controlled current source 13 is shut off when the design value and the actual value of the parameter are the same. Because of the kinetics of the chemical transformation process at the boundary surface between the thin film path 2 and the electrolyte 4, the final value of the parameter $U_A$ of the component 8 does not come out at the design value, but rather at a value somewhat deviating therefrom. In FIG. 3 the controlled current source is switched on at the instant $t_O$. The output voltage $U_A$ now moves along the voltage-time course 18 until at the instant $t_1$ the actual value of the output voltage $U_A$ coincides with the design value of that voltage. The controlled current source 13 is now shut off. In consequence there is still a small voltage jump at the instant $t_1$, so that the final value of the output voltage $U_A$ lies below the design value $U_S$. The voltage difference $\Delta U$ between these two values depends upon the parameter value of the component 8 lies within a predetermined region adjacent to the design value. This is, for example, possible to provide if the current $i_H$ delivered by the controllable current source 13 produces a voltage drop in the thin film path that is substantially smaller than the voltage drop produced by the normal current $i_N$ flowing through the thin film path under design conditions of operation. In a particularly preferred embodiment of the invention the trimming process is therefore carried out by first operating in a first region with high auxiliary current and then switching over into a second region when the difference between the measured and design values drops below a certain limit amount. FIG. 3 shows an arrangement for making use of the above described method of adjusting or trimming and electronic component of the integrated circuit type. In this case there is shown a high frequency amplifier 20 that is supplied by a voltage source 24 and it is assumed that the amplifier is to be adjusted or trimmed with regard to its amplification factor. For this purpose, the feedback resistor 21 is provided as a thin film path and has applied to it an electrode 22 that is provided to the positive pole of a second voltage source 23. By suitable adjustment of the current through the electrode 22 the value of the feedback resistance 21 is increased in the manner described above until the amplification factor of the high frequency amplifier 20 has reached the desired value. Of course, it is also possible here to control the flow of current to the electrode 22 by the value at the particular moment of the amplification factor of the high frequency amplifier 20. The value of the voltage drop produced in the feedback resistance 21 by the anodizing current is made so small that the backward acting effect of the voltage drop on the amplification properties of the high frequency amplifier 20 lie within a predetermined small region.

Although the invention has been described with reference to particular illustrative examples, it will be recognized that variations and modifications can be made within the inventive concept.

We claim:

1. A method of trimming to specification electrical components containing thin film circuits having a circuit element determining electrical characteristics of the perspective components, which method comprises the steps of:

passing an auxiliary current through a thin film path of said thin film circuits of an electrical apparatus component to produce chemical change of the conductivity of said thin film path while at the same time the component is energized as for typical operating conditions, in such a way that the voltage drop produced by the auxiliary current ($i_H$) in said thin film path influences an electrical characteristic to be adjusted by the trimming process, at the end of said process, only within a predetermined range, and measuring the said characteristic to be adjusted while said auxiliary current flows through said path in order to determine when the flow of said auxiliary current should be stopped.

2. A method as defined in claim 1 in which the magnitude of said auxiliary current ($i_H$) is small compared with the magnitude of current produced by said typical operating conditions ($i_N$) in the same path.

3. A method as defined in claim 1 in which said thin film circuits are constituted in a form having at least one externally accessible resistance connected into an integrated electronic circuit.

4. A method as defined in claim 1, in which the step of chemically changing the conductivity of a thin film path is performed by covering said thin film path (2) with an electrolyte (4), introducing an electrode (5) in said electrolyte (4) and passing the auxiliary current ($i_H$) through said electrolyte (4) and said thin film path (2).

5. A method as defined in claim 4, in which said thin film path (2) is formed of tantalum and said electrolyte (4) is a paste containing $OH^-$ ions.

6. A method as defined in claim 1, in which during the performance of the trimming method at least one parameter characterizing the electrical properties of a component (8) is measured and the amplitude of the auxiliary current ($i_H$) is controlled in dependence upon the value of said parameter.

* * * * *